United States Patent [19]

Lee et al.

[11] Patent Number: 5,346,597
[45] Date of Patent: Sep. 13, 1994

[54] PROCESS FOR ETCHING ORGANIC POLYMERIC MATERIALS

[75] Inventors: Rong-Jer Lee, Lin Nei Town; Shy-Ming Ho, Hsinchu; Tsung H. Wang, Taichung, all of Taiwan

[73] Assignee: Industrial Technology Institute, Chutung, Taiwan

[21] Appl. No.: 127,327

[22] Filed: Sep. 27, 1993

[51] Int. Cl.$^5$ ............................................. C25F 3/02
[52] U.S. Cl. ............................ 204/129.1; 204/129.4; 204/129.65; 204/129.75; 204/129.95; 204/131
[58] Field of Search ............ 204/129.4, 131, 129.75, 204/129.95, 129.65, 129.1

[56] References Cited

U.S. PATENT DOCUMENTS

| | | | |
|---|---|---|---|
| 4,836,888 | 6/1989 | Nojiri et al. | 204/129.65 X |
| 5,151,162 | 9/1992 | Müller et al. | 204/131 |
| 5,203,955 | 4/1993 | Viehbeck et al. | 204/129.75 X |
| 5,246,552 | 9/1993 | Kamiya et al. | 204/131 |

Primary Examiner—Donald R. Valentine
Attorney, Agent, or Firm—W. Wayne Liauh

[57] ABSTRACT

A wet etching process for forming vias or pre-designed patterns in organic polymeric layers such as fully or substantially fully cured polyimide layers which are used as circuit carriers in laminated integrated circuits by placing said organic polymeric layer in an etching bath containing two electrodes immersed in an etching solution and applying an alternating current having a voltage of about 0.3 to 1.0 volt and a frequency of about 60 Hz, or a direct current of about 0.8 to 20 volt to the electrodes. The etching solution contains acid or metallic hydroxide and, optionally, 3–15 wt % N-methyl-2-pyrrolidone. The present invention provides a fast and safe etching technique without the need to use the toxic and explosive etching chemicals such as hydrazine hydrate or ethylene diamine.

14 Claims, 2 Drawing Sheets

PROCESS FOR ETCHING ORGANIC POLYMERIC MATERIALS

FIELD OF THE INVENTION

This invention relates to a process for the wet etching of organic polymeric materials. More particularly, this invention relates to a wet etching process for forming vias or predesigned patterns in organic polymeric layers such as polyimide layers which can be used as circuit carriers in laminated integrated circuits.

BACKGROUND OF THE INVENTION

Thermally stable polymers with low dielectric constant such as polyimides have been widely used as insulating substrates for use in making flexible printed circuits. By imparting photosensitivity, these polymers can also be used as photoresist in the preparation of laminated printed circuits.

Typically, a laminated integrated circuit is formed by etching a polyimide layer, either to improve its adherence properties or to provide pathways, or the so-called vias, through the polyimide layer to allow for electrical connections to be made between the different layers of metallurgy. An example of such etching process in disclosed in U.S. Pat. No. 4,606,998, in which a metal layer is applied to the polyimide layer in which vias have been formed by anisotropic etching through a photoresist mask. The content of the U.S. Pat No. '998 patent is incorporated by reference.

Generally, the conventional etching method of polyimide type resin layers can be classified into dry etching and wet etching. The dry etching method typically uses $O_2$ plasma or $O_2$ sputtering, with which a masking film such as Mo or Cr or other inorganic films are often required. The dry etching method has the advantage that it allows a better etching profile to be obtained. However, the dry etching method also has several drawbacks, such as the complexity of the process and the number of steps required, it the high cost and relatively low etching rate.

The wet etching method, on the other hand, involves a less expensive process and can be employed in a continuous process. The wet etching method typically uses strong acids or alkalines in the etching process. For high performance polymers such as polyimide which cannot be easily etched, the wet etching process often requires the use of highly dangerous chemicals such as hydrazine to degenerate the polymer. One technique for wet etching of fully or substantially fully cured polyimide is to use hydrazine hydrate and a polyamine such ethylene diamine. Wet etching of moderately or slightly cured polyimide (i.e., containing significant amounts of polyamic acids) can be achieved by using a metallic hydroxide. For chemically cured polyimide, in which the packing of the film is not as dense as thermally cured polyimides, wet etching can be effected using relatively highly concentrated hot potassium hydroxide. Because of the high chemical stability and solvent resistance of polyimides, wet etching method typically requires long etching times, in the presence of dangerous and/or explosive chemical solvents, such as hydrazine hydrate and polyamines. Furthermore, in addition to its high toxicity, hydrazine hydrate also exhibits high resin permeability, thus limiting the selection of suitable photoresists that can be used as masking material.

U.S. Pat. No. 4,436,583 discloses a wet etching method of a polyimide type resin film using an etching solution consisting of 20 to 40% by volume of hydrazine hydrate and 60 to 80% polyamine. Hydrazine is known to be a cancer-causing agent, and, as a result, its maximum allowable concentration in air is only less than 0.1 ppm. The use of hydrazine often causes great apprehensions among the workers and is a great environmental concern. Furthermore, because of the high resin permeability of hydrazine, it can invade the photoresist mask and cause distortions of the desired polyimide pattern. The extent of distortion becomes more profound for relatively more fully cured polyimide, or when the polyimide layer has a relatively large thickness. In both instances, longer etching times are required.

U.S. Pat. No. 4,846,929 discloses a wet etching method by which polyimide is etched by contacting the polyimide with an aqueous solution of a metal hydroxide followed by contact with an acid followed by contact again with an aqueous solution of a metal hydroxide. The U.S. Pat. No. '929 patent provides a relatively fast and safe wet etching method for polyimide; however, it can cause severe corrosion problems for the conductive circuits such as copper metals.

U.S. Pat. No. 4,960,491 discloses a method for the wet etching of polymeric materials, in particular polyimide, by reacting the polymer with either an acid or an alkaline etching solution in the presence of a reactive material such as aluminum metal in order to generate nascent hydrogen and improve the etching rate. One of the disadvantages of the method disclosed in the U.S. Pat. No. '491 patent is the generation of a metal-containing liquid pollutant stream. Also this process is difficult to control and the etching rate is greatly affected by the concentration of the acid or alkaline solution.

European Patent Application EP 0373374 discloses a wet etching method by which metallic carbonate is added to a metallic hydroxide etching solution to reduce the extent of undercutting. This method, however, does not improve the etching rate.

SUMMARY OF THE INVENTION

The primary object of the present invention is to provide a method for the wet etching of organic polymeric materials such as polyimides without requiring the use of dangerous or explosive chemicals such as hydrazine. More particularly, the primary object of the present invention is to provide a fast wet etching process, which utilizes an acid or alkaline solution in the presence of an externally applied alternating current, for forming vias or pre-designed patterns in organic polymeric layers such as polyimide layers which will be used as circuit carriers in laminated integrated circuits.

The present invention can be used to effectively etch fully or substantially fully cured polyimide resins with a reduced etching. A fully cured polyimide resin exhibits several highly desirable chemical, physical and electrical properties, such as excellent dimensional stability, excellent resistance to solvents, strong acids, strong alkalis and other chemicals, and high adhesion with copper. These properties make the fully cured polyimide an excellent material for use in making the dielectric layer in laminated integrated circuits.

The present invention is most advantageous for selectively etching fully or substantially fully cured polyimide resins using an etching mask, which can be a positive type or negative type photoresist. A photoresist material is often employed to provide a desired selective etching pattern for the polyimide layer. Typically, a polyimide substrate is provided on the surface thereof with a photoresist. The photoresist is exposed to light and thereby developed to define where the polyimide is to be subsequently etched. A positive photoresist is the type of photoresist mask wherein the exposed areas are removed during the subsequent development to show the desired etching pattern. A negative photoresist works in the opposite way, in that the unexposed areas are removed during the subsequent development to show the desired etching pattern. Naphthoquinonediazide is a commonly used positive type photoresist. Other positive type photoresists include Novolac type resins that are soluble in an alkaline solution. Examples of negative type photoresists include cyclic rubbers (such as OMR 83). With the method disclosed in the present invention, the metallic circuitry that might be present along with the photoresist material will be adversely affected during the etching step. If so desired, the photoresist etching mask can be plated with a metallic coating, such as a 1–5 μm nickel layer, to further protect the portions of the polyimide layer that are not to be etched. The ability to preserve the integrity of metallic circuitry is one of the advantages of the process disclosed in the present invention.

In the process disclosed in the present invention, a polyimide layer to be etched is placed inside an acid or alkali solution containing two electrodes, to which an alternating current will be applied. The polyimide can be placed on one of the electrodes, or it can be placed on a substrate. On the surface of the polyimide layer, a layer of corrosion-resistant organic photoresist or a metallic plating can be applied to provide the desired etching pattern. The etching solution can be an acid such as a sulfuric acid solution, or it can be a metallic hydroxide solution. The concentration of an metallic hydroxide solution should be at least 4N. Preferably, the concentration of an metallic hydroxide solution is between 4 and 15N.

The voltage of the alternating current should be at least 0.3 V. Preferably the voltage of the alternating current is between 0.8 and 1.0 V. Because of the redox reactions that take place during the etching process, the temperature of the etching bath may be increased to a noticeable extent. The voltage of the alternating current may be adjusted to avoid excessive heating. Alternately, a temperature control system my be employed to maintain desired heat balance. The former approach is preferred for energy conservation. It is preferred that the temperature of the etching bath is maintained between 60° and 100° C.

Although the process disclosed in the present invention requires only an acid or metallic hydroxide as the etching solution under an externally applied alternating current, other additives, such as 3–15 wt % N-methyl-2-pyrrolidone or propanol or other alcohols, can be added to further increase the etching rate of polyimide. As discussed above, the present invention does not require polyamine or hydrazine, which are highly toxic chemicals, to prepare the etching solution. Furthermore, a small amount of potassium carbonate can be added to the etching solution to minimize the possibility of occurrence of undercut in the etching pattern. Alternately, a direct current can be used, in the place of an alternating current, to improve the etching rate of the wet etching process disclosed in the present invention. When a direct current is to be used, the electrodes can be placed in the same bath or in separate bathes connected with an electrolyte bridge, and the voltage should be between 0.5 and 20 V. The direct current can be a result of a reduction-oxidation potential between two electrodes.

The process disclosed in the present invention can be used to etch other polymers including polyesterterphthalate and modified polyimides such as polyamide-imide-esters, polyamide-imides, polysiloxane-imides, etc. This invention can also be used to successfully etch a double-layered polyimide/bismalemic modified polyimide substrate. The double-layered polyimide/bismalemic modified polyimide substrate, which has been disclosed in a pending U.S. patent application Ser. No. 07/991,287, and the content thereof is incorporated herein by reference, has substantially improved adhesion with copper without the need to use adhesives.

DETAILED DESCRIPTION OF THE PREFERRED EMBODIMENTS

The present invention will now be described more specifically with reference to the following examples. It is to be noted that the following descriptions of examples including preferred embodiments of this invention are presented herein for purpose of illustration and description; it is not intended to be exhaustive or to limit the invention to the precise form disclosed.

EXAMPLE 1

Figure 1:
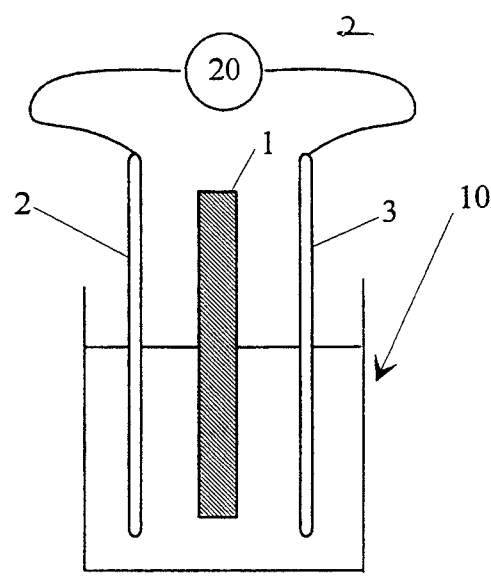
FIG. 1 is a schematic diagram illustrating the process disclosed in the present invention, in which a polyimide member is placed between two electrodes in an etching bath; an alternating current is applied to the two electrodes.

FIG. 1 is a schematic diagram illustrating the process disclosed in the present invention. In FIG. 1 a laminated circuit board containing a polyimide member 1 was placed between two electrodes 2 and 3 in an etching bath 10; an alternating current was applied to the two electrodes from a current source 20.

Figure 3:
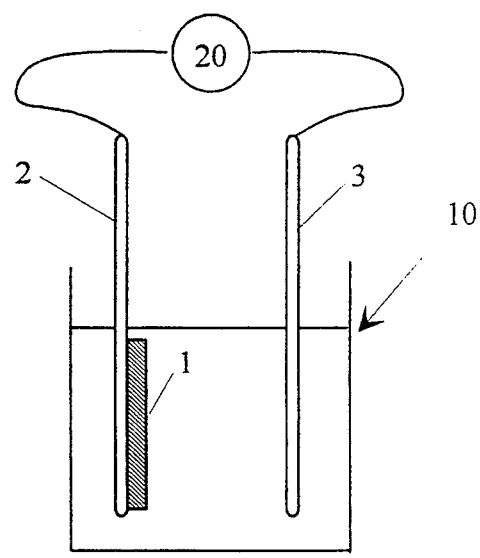
FIG. 3 is a schematic diagram illustrating another embodiment of the process disclosed in the present invention, in which the polyimide member is placed on one of the electrodes.

Now referring to FIG. 3, a laminated board 1 containing a copper layer and two polyimide layers, an upper polyimide layer and a lower polyimide layer, was prepared. The upper polyimide layer contained 0.75 parts biphenyl-3, 3', 4, 4'-tetracarboxylic dianhydride (BPDA), 0.05 parts pyromellic anhydride (PMDA), 0.18 parts 3, 3', 4, 4'-benzophenone tetracarboxylic dianhydride (BTDA), 0.85 parts 4, 4'-diaminodiphenyl ether (ODA), and 0.15 parts p-phenylene diamine (PDA). The composition of the lower layer was identical to that in the upper layer, except that it further contained a barbituric acid modified bismaleimide (barbituric acid modified BMI). Both the upper and lower polyimide layers had the same thickness. The methods of preparing the polyimide and the modified BMI has been disclosed in a pending U.S. patent application Ser. No. 07/991,287. One advantages of using the double-layer polyimide as described above is that excellent adhesion with a copper layer can be obtained without the use of an adhesive. However, the method disclosed in the present invention can be applied to laminated boards containing an adhesive layer between the polyimide layer and the copper layer.

The laminated board was placed inside an oven, whose temperature was increased from room temperature to 350° C. at a rate of 1° C./min, and maintained 350° C. for 2 hours. The hardened polyimide layers had an aggregate thickness of 2 mil. An etching bath was prepared which contained 10N KOH and 5 wt % NMP. The etching bath temperature was maintained at about 95° C. Two electrodes 2 and 3 were inserted into the etching bath which were connected to an alternating current 20 at a voltage of 1.5 V and a frequency of 60 Hz.

As shown in FIG. 3 The hardened laminated board 1 was placed into the etching bath 10 by hanging the laminated board 1 onto one of the electrodes 2. The other electrode 3 was made of stainless steel. Etching times with and without the application of the alternating current were measured. The etching time required was 15 minutes in the presence of the alternating current, and was 40 minutes in the absence thereof.

EXAMPLE 2

The laminated polyimide board to be etched in Example 2 was similar to those in Example 1, except that the polyimide board was applied thereon with a negative type photoresist, OMR83, which is a cyclic rubber obtained from Dynachem. The photoresist was coated onto the polyimide layer using a spin coating technique to form a thin layer. After exposure to UV and subsequent development and oven heating, a pre-designed pattern was formed on the polyimide layer. The etching bath contained 12N KOH, 5 wt % NMP and was maintained at a temperature of about 100° C.

The etching bath contained two electrodes 2 and 3, one made of stainless steel and the other of copper. The laminated board with the coated layer of photoresist was placed inside the etching bath in a position approximately mid-way between the two electrodes 2 and 3. Etching times with and without the application of the alternating current were measured. The etching time required was 15 minutes in the presence of the alternating current, and was 40 minutes in the absence thereof.

Figure 2:
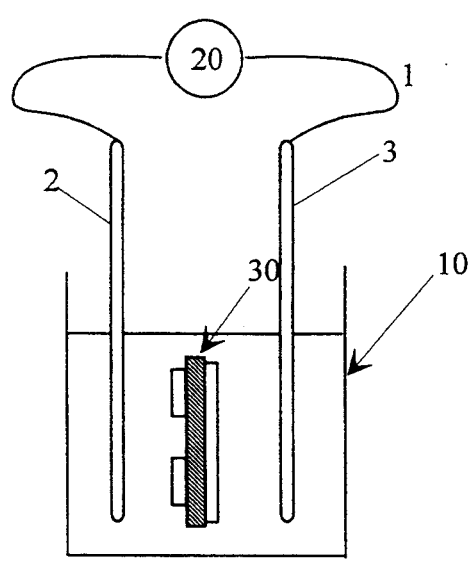
FIG. 2 is a schematic diagram illustrating an embodiment of the process disclosed in the present invention, in which the polyimide member is part of a simulated flexible circuit board, which is in turn placed between two electrodes in an etching bath; an alternating current is applied to the two electrodes and the polyimide member has a layer of photoresist on the surface thereof.

As shown in FIG. 2, a simulated flexible circuit board 30 was placed into the etching bath 10 between the two electrodes 2 and 3. The simulated flexible circuit board contains a polyimide member 1, which has a layer of photoresist 4 and a metal layer on the principal surfaces, respectively, thereof.

EXAMPLE 3

The laminated board to be etched in Example 3 and the etching solution were identical to those in Example 2, except that the etching solution further contained 30 wt % of hydrazine hydrate. It was observed that the photoresist layer was peeled off after two minutes in the etching bath, thus was unable to provide the pattern on the polyimide layer as intended.

EXAMPLE 4

The laminated board to be etched in Example 4 and the etching solution were identical to those in Example 1, except that the etching solution contained 12N KOH and 5% NMP, and the etching bath was maintained at a temperature of about 100° C. Further, instead of an alternating current as used in Example, a direct current of 1.2 V was used in Example 4. Both electrodes in Example 4 were made of platinum having a dimension of 2 cm (width)×2 cm (height). The etching time required was 15 minutes in the presence of the direct current, and was 40 minutes in the absence thereof.

EXAMPLE 5

Figure 4:
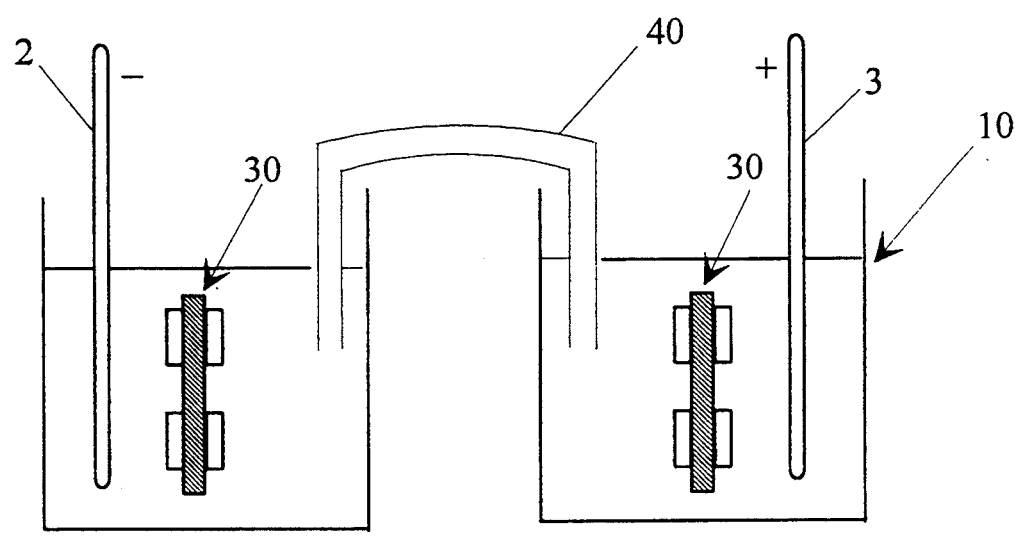
FIG. 4 shows two etching baths connected by an electrolyte bridge.

The laminated board to be etched in Example 5 and the etching conditions were identical to those in Example 4, except that the etching bath was maintained at a temperature of about 95° C. Two etching baths were prepared, into each etching bath a laminated board was placed. The two etching baths were connected by an electrolyte bridge 40, as shown in FIG. 4. The etching time required was 15 minutes for both boards.

EXAMPLE 6

A laminated polyimide board having a protected pattern prepared with the same procedure as in Example 2 was placed into an etching both containing 40 wt % hydrazine, 20 wt % KOH, 10 wt % NMP and 30 wt % water at 100° C. The photoresist was peeled off while the polyimide was not etched. With an ecthing solution containing 12N KOH and 5% NMP at 95° C. and a direct current of 1.2 V, the polyimide was etched in 15 minutes while the photoresist was unaffected.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for etching a polymeric resin comprising the steps of:
   (a) placing said polymeric resin to be etched in an etching bath which contains two electrodes immersed in an etching solution, said etching solution comprises an acid or a metallic hydroxide; and
   (b) applying an alternating current to said electrodes.

2. The method for etching a polymeric resin of claim 1 wherein said etching solution does not contain hydrazine hydrate or ethylene diamine.

3. The method for etching a polymeric resin of claim 1 wherein said alternating current has a voltage of at least 0.3 volts.

4. The method for etching a polymeric resin of claim 1 wherein said alternating current has a voltage between 0.8 and 1.0 volts.

5. The method for etching a polymeric resin of claim 1 wherein said alternating current has a frequency of about 60 Hz.

6. The method for etching a polymeric resin of claim 1 wherein said etching solution further contains 3–15 wt % N-methyl-2-pyrrolidone or propanol or other alcohols.

7. The method for etching a polymeric resin of claim 1 wherein said polymeric resin is a polyimide layer used as a circuit carrier in laminated integrated circuits.

8. The method for etching a polymeric resin of claim 7 wherein said polymeric resin is coated with an organic photoresist masking material.

9. The method for etching a polymeric resin of claim 1 wherein said polymeric resin is attached to one of said electrodes.

10. The method for etching a polymeric resin of claim 1 wherein said polymeric resin is placed between said electrodes.

11. The method for etching a polymeric resin of claim 1 wherein said polymeric resin is polyimide, polyester, polysiloxane, epoxy resin, polyesterphthalate or modified polyimides such as polyamide-imide-esters, polyamide-imides, polysiloxane-imides.

12. The method for etching a polymeric resin of claim 1 wherein said metallic hydroxide has a concentration of between 4 and 15N.

13. A method for etching a polymeric resin comprising the steps of:
    (a) placing said polymeric resin to be etched in an etching bath which contains two electrodes immersed in an etching solution, said etching solution comprises an acid or a metallic hydroxide; and
    (b) applying a direct current of between 0.5 and 20 V to said electrodes.

14. The method for etching a polymeric resin of claim 13 wherein said electrodes are placed in two separate etching baths, respectively, connected by an electrolyte bridge.

* * * * *